United States Patent [19]
Labib

[11] Patent Number: 5,130,295
[45] Date of Patent: Jul. 14, 1992

[54] PASSIVATING THIN FILM FOR SUPERCONDUCTING MATERIAL

[75] Inventor: Mohamed E. Labib, Mercer, N.J.

[73] Assignee: Consortium for Surface Processing, Hoboken, N.J.

[21] Appl. No.: 293,850

[22] Filed: Jan. 5, 1989

[51] Int. Cl.$^5$ .............................. B32B 9/00
[52] U.S. Cl. ........................ 505/1; 505/701; 505/702; 505/703; 505/704; 428/76; 428/688; 428/930
[58] Field of Search ................. 505/1, 701–704; 29/599; 428/209, 457, 688, 930, 76

[56] References Cited
PUBLICATIONS

CA 109(18):161913j Michigami et al Feb. 12, 1988 JP 63032974.
CA 108(8):66977d Wang et al Jap Journ Appl Phys L191820 1987.
CA 110(2):14010e Surface and Interface Properties of High Temp SCs Meyer III et al 1988.
Solid State Communcations, vol. 66, No. 3, pp. 287–290, 1988 Kim et al.
Reviews of Solid State Science, vol. 1, No. 2, 1987 pp. 207–219 Ovshinsky et al.
Applied Physics Letters, vol. 53, No. 17, Hill et al, pp. 1657–1659 Oct. 24, 1988, Passivation of High Tc Superconductor Surfaces with $CaF_2$ . . .
R. L. Barns and R. A. Laudise, "Stability of Superconducting $YBa_2Cu_3O_7$ in the Presence of Water," *Appl. Phys. Lett.*, vol. 51, No. 17, 26 Oct. 1987, pp. 1373–1375.

*Primary Examiner*—Patrick J. Ryan

[57] ABSTRACT

The superconducting material $YBa_2Cu_3O_7$, which loses its superconducting qualities when exposed to water, is passivated against such water damage by a thin film on its surface comprised of a mixed phase which includes $YBa_2Cu_3O_{(7-x)}F_{2x}$, where $0 < X \leq \frac{1}{2}$.

1 Claim, 1 Drawing Sheet

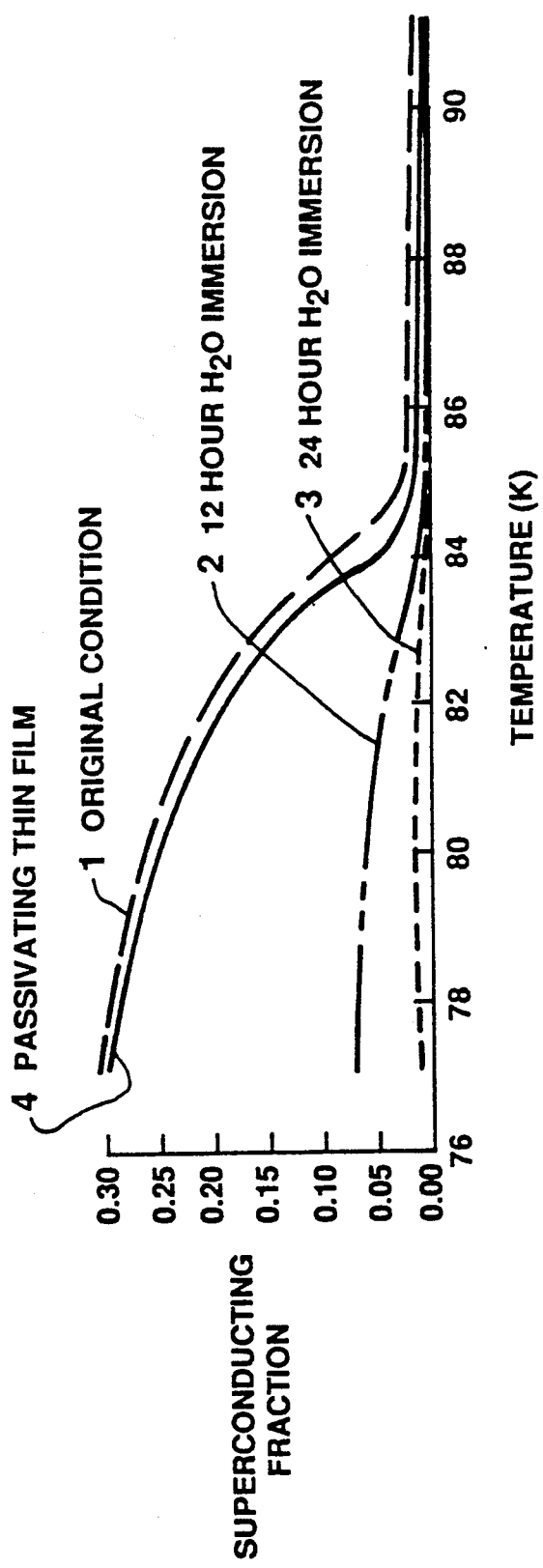

PASSIVATING THIN FILM FOR SUPERCONDUCTING MATERIAL

BACKGROUND OF THE INVENTION

In early 1987, it was discovered that $YBa_2Cu_3O_7$ material (in the form of a ceramic) becomes superconducting at a relatively high cryogenic temperature, which is desirable. However, it was soon learned that $YBa_2Cu_3O_7$ material suffers from a major problem. Specifically, if a volume of bulk $YBa_2Cu_3O_7$ material is exposed to water ($H_2O$), either by immersion or by contact of its surface with moist air, $YBa_2Cu_3O_7$ chemically reacts with such water and thereby tends to lose its superconductive qualities. The present invention overcomes this problem.

SUMMARY OF THE INVENTION

It has been discovered that placing the surface of the given volume of bulk $YBa_2Cu_3O_7$ superconductor material in contact with a reactive species of fluoride ion for a given time sufficient for the fluoride ion to react with the $YBa_2Cu_3O_7$ material results in the generation of a thin-film on the surface of the $YBa_2Cu_3O_7$ superconductor material which passivates the material against a superconductor-destroying reaction with water in the ambient, while permitting a substantially non-resistive electrical connection to be made to the outer surface of the generated thin film from the exterior of the superconductor.

DESCRIPTION OF THE DRAWING

The sole FIGURE graphically distinguishes between the effect on superconductivity by immersion in water for a specified time (1) of a given volume of non-passivated bulk $YBa_2Cu_3O_7$ material and (2) such given volume of bulk $YBa_2Cu_3O_7$ material after being passivated by a thin-film surface cover therefor in accordance with the principles of the present invention.

DESCRIPTION OF THE PREFERRED EMBODIMENTS

As is known in the art, $YBa_2Cu_3O_7$, in its original condition, exhibits a relatively high superconducting fraction at relatively high cryogenic temperatures. The term "superconducting fraction" is defined as a measure of the ratio of the magnetic susceptance of a given volume of a superconductor material at any specified temperature to the magnetic susceptance of the same given volume of a diamagnetic material (e.g., aluminum). By way of example, plot 1 of the graph shown in the sole FIGURE shows that a given volume of bulk $YBa_2Cu_3O_7$ material (in a "green" ceramic form) exhibits a superconducting fraction of about 30% at an absolute temperature of about 77° K, when the $YBa_2Cu_3O_7$ material is in its original condition. As indicated in plot 1, the superconducting fraction falls to nearly zero at absolute temperatures above 85° K, when the $YBa_2Cu_3O_7$ material is in its original condition.

Plots 2 and 3, respectively, show what happens to the superconducting fraction of the aforesaid volume of bulk $YBa_2Cu_3O_7$ material after it has been immersed in water for 12 hours and 24 hours, respectively. As indicated by plot 2, after a 12 hour immersion, the superconducting fraction has been reduced from about 30% to about 7% at an absolute temperature of about 77° K (and then falls to zero as the temperature rises). As indicated by plot 3, after a 24 hour immersion in water, the superconducting fraction of the aforesaid given volume of bulk $YBa_2Cu_3O_7$ material is reduced to nearly zero at all temperatures. Comparison of each of plots 2 and 3 with plot 1 of the FIGURE shows that the water-immersed given volume of bulk $YBa_2Cu_3O_7$ material is subject to a chemical reaction with the water that contacts its surface, which chemical reaction tends to render the material a non-superconductor.

It has been found that this superconductor-destroying chemical reaction by water results in the pH of the water in which the material is immersed changing from its original substantially neutral pH prior to immersion of the $YBa_2Cu_3O_7$ material to a substantially basic pH due to the aforesaid chemical reaction.

In accordance with the present invention, it has been discovered that dissolving a soluble compound (e.g., $NH_4F$ or $NH_4HF_2$) in the water prior to the immersion of the $YBa_2Cu_3O_7$ material results in the generation, after a given time, of a passivating thin film on the surface thereof, provided that the solution concentration of the soluble fluoride ion compound is at least sufficient to maintain the pH of the solution acidic during the given time in which the solution is chemically reacting with the immersed $YBa_2Cu_3O_7$ material to generate the passivating thin film on the surface thereof. This given time has been found to be at least one hour.

At the end of the aforesaid given time, the $YBa_2Cu_3O_7$ material with its generated passivating thin film on its surface, is removed from the fluoride ion solution, and then rinsed with substantially neutral pH water and air-dried.

The generated thin-film covering the surface of the $YBa_2Cu_3O_7$ material passivates the material against the above-discussed reaction with water which tends to destroy its superconducting qualities. Further, the passivating thin-film itself, besides protecting the material from this superconducting-destroying chemical reaction with water, exhibits a superconducting fraction at cryogenic temperatures which is nearly as large as the superconducting fraction, as a function of absolute temperature, of a passivating-thin-film covered $YBa_2Cu_3O_7$ material, after such material had been re-immersed in substantially neutral pH water for 12 hours. In this case, the passivating thin film had been generated by a prior immersion in a 10% solution of $NH_4HF_2$ (which was sufficient to maintain the solution acidic during the generation of the passivating thin film).

An additional experiment, employing only a 2% solution of $NH_4HF_2$, was insufficient to maintain the pH of the solution acidic during the entire reaction time with the $YBa_2Cu_3O_7$ material. Immersion in such a 2% solution did not result in the generation of a passivating thin-film covering the surface of the $YBa_2Cu_3O_7$ material.

It appears that the passivating thin-film, generated by the process described above, is comprised of a mixed phase that includes $YBa_2Cu_3O_{(7-x)}F_{2x}$, where $0 < X \leq \frac{1}{2}$, and $BaF_2$. The mixed phase, perhaps, may also include one or more unknown compounds. Preferably, the length of the given reaction time for generating the passivating thin-film should be sufficient to provide a value of X that is substantially equal to one-half at the outer surface of the thin film. In this case, the value of X at the interface of the thin-film and the underlying surface of the material is substantially zero, and then the value of X gradually rises from substantially zero at the interface to substantially one-half at the outer surface of the thin-film.

In the process described above, the acidic solution which generates the passivating thin film results from the dissociation of the soluble fluoride ion compound. It is believed that the passivating thin-film generating process is not limited to dissociated fluoride ions of a soluble fluoride ion compound dissolved in water, but includes other reaction species of fluoride ion placed in contact with the surface of the $YBa_2Cu_3O_7$ superconductor material for the aforesaid given time. For instance, it is believed that hydrogen fluoride in gaseous form would be such a reactive species of fluoride ion.

What is claimed is:

1. In a superconductor comprised of a given volume of bulk $YBa_2Cu_3O_7$, material which is subject to chemical reaction with $H_2O$ in the ambient that contacts the surface thereof, said chemical reaction tending to render said material non-superconducting; the combination with said material including:

a superconducting passivating thin film comprised of a mixed phase which includes $YBa_2Cu_3O_{(7-x)}F_{2x}$, where $0 < X \leq \frac{1}{2}$, on the surface of said material for protecting said material from contact with said $H_2O$, while permitting a substantially non-resistive electrical connection to be made to the outer surface of said thin film that covers said material from the exterior of said superconductor;

wherein the value of X gradually rises from substantially zero at the interface of said thin film and said surface of said material to substantially one-half at said outer surface of said thin film.

* * * * *